United States Patent
Willis

(10) Patent No.: US 9,551,760 B2
(45) Date of Patent: Jan. 24, 2017

(54) REVERSE ENERGY FLOW IN SOLAR AND OTHER POWER GENERATION SYSTEMS FOR THEFT DETECTION, PANEL IDENTIFICATION AND DIAGNOSTIC PURPOSES

(71) Applicant: HIQ SOLAR, INC., Santa Clara, CA (US)

(72) Inventor: Andre P. Willis, Palo Alto, CA (US)

(73) Assignee: HiQ Solar, Inc., Santa Clara, CA (US)

( * ) Notice: Subject to any disclaimer, the term of this patent is extended or adjusted under 35 U.S.C. 154(b) by 224 days.

(21) Appl. No.: 14/203,883

(22) Filed: Mar. 11, 2014

(65) Prior Publication Data
US 2014/0266294 A1   Sep. 18, 2014

Related U.S. Application Data

(60) Provisional application No. 61/781,522, filed on Mar. 14, 2013.

(51) Int. Cl.
*G01R 31/40* (2014.01)
*H02S 50/10* (2014.01)
*H01L 31/02* (2006.01)

(52) U.S. Cl.
CPC ....... *G01R 31/405* (2013.01); *H01L 31/02021* (2013.01); *H02S 50/10* (2014.12); *Y02E 10/50* (2013.01)

(58) Field of Classification Search
None
See application file for complete search history.

(56) References Cited

U.S. PATENT DOCUMENTS

| 5,726,573 A | * | 3/1998 | Chen | G01R 31/3631 320/106 |
| 6,278,279 B1 | * | 8/2001 | Daun-Lindberg | G01R 31/40 324/427 |
| 8,624,436 B2 | | 1/2014 | Willis | |
| 2010/0007212 A1 | | 1/2010 | Zanarini et al. | |
| 2010/0295375 A1 | * | 11/2010 | Oshida | B60L 3/003 307/66 |

OTHER PUBLICATIONS

Linear Technology (Milpitas, CA), Synchronous Step-Up Controller—LTC3814-5, pp. 1-30.

* cited by examiner

*Primary Examiner* — Paresh Patel
(74) *Attorney, Agent, or Firm* — Fountainhead Law Group P.C.

(57) ABSTRACT

System and method for applying a reverse energy flow for measuring one or more electrical characteristics of a DC power source, such as a solar panel. Applying reverse current and voltage to a DC power source and measuring selected resultant current and voltage enables monitoring of electrical characteristics of the source, and when done periodically, enables monitoring of the performance of the source over time, including whether performance has become affected by a hardware failure or damage, or whether the source has become disconnected due to a faulty or failed connector or theft.

13 Claims, 7 Drawing Sheets

REVERSE ENERGY FLOW IN SOLAR AND OTHER POWER GENERATION SYSTEMS FOR THEFT DETECTION, PANEL IDENTIFICATION AND DIAGNOSTIC PURPOSES

RELATED APPLICATIONS

This application claims priority to and the benefit of U.S. Patent Application 61/781,522, entitled "Reverse Energy Flow In Solar and Other Power Generation Systems For Theft Detection, Panel Identification and Diagnostic Purposes," which was filed on Mar. 14, 2013, the disclosure of which is incorporated herein by reference.

BACKGROUND

The present invention relates to power generation systems, such as solar panel systems, and in particular, to power generation systems in which reverse energy flows are used to measure characteristics of the energy source.

A typical DC power generation system employs a power converter to interface to the AC grid, battery array, etc. An example would be a solar power system, which uses an inverter to convert DC power from solar panels to AC and/or batteries. As shown in FIG. 1, in such a system energy flows from the power source (101), through the converter (102), out to the load (103).

SUMMARY

In accordance with the presently claimed invention, a system and method are provided for applying a reverse energy flow for measuring one or more electrical characteristics of a DC power source, such as a solar panel. Applying reverse current and voltage to a DC power source and measuring selected resultant current and voltage enables monitoring of electrical characteristics of the source, and when done periodically, enables monitoring of the performance of the source over time, including whether performance has become affected by a hardware failure or damage, or whether the source has become disconnected due to a faulty or failed connector or theft.

In accordance with one embodiment of the presently claimed invention, a system for applying a reverse energy flow for measuring one or more electrical characteristics of a DC power source includes: one or more electrodes for connecting to a DC power source, including an output electrode for conveying a voltage, a source current originating from the DC power source and a reverse current to the DC power source; transducer circuitry coupled to at least the output electrode and responsive to one or more electrical signals by providing at least one transducer signal related to respective values of each one of the one or more electrical signals, wherein the one or more electrical signals include at least one of the voltage and reverse current; control circuitry coupled to the transducer circuitry and responsive to the at least one transducer signal by providing one or more control signals; and a reverse power source coupled to the control circuitry and at least the output electrode, and responsive to the one or more control signals by providing the reverse current.

In accordance with another embodiment of the presently claimed invention, a method for applying a reverse energy flow for measuring one or more electrical characteristics of a DC power source includes: connecting to one or more electrodes of a DC power source, including an output electrode for conveying a voltage, a source current originating from the DC power source and a reverse current to the DC power source; responding to one or more electrical signals received via at least the output electrode by providing at least one transducer signal related to respective values of each one of the one or more electrical signals, wherein the one or more electrical signals include at least one of the voltage and reverse current; responding to the at least one transducer signal by providing one or more control signals; and responding to the one or more control signals by providing the reverse current via at least the output electrode.

DETAILED DESCRIPTION

As discussed in more detail below, exemplary embodiments of the presently claimed invention enable: measuring of power source characteristics using a reverse flow of energy; implementing a theft-detection scheme that minimizes false alarms day and night; and monitoring system health and detecting faults. By periodically sending energy in the reverse direction, i.e., upstream to the energy source, one can derive information about the energy source.

Reverse Energy Flow

The aim is to produce a short duration pulse that can be used to measure the properties of the power source. A preferred implementation is described in FIGS. 2A-2C.

Figure 1:
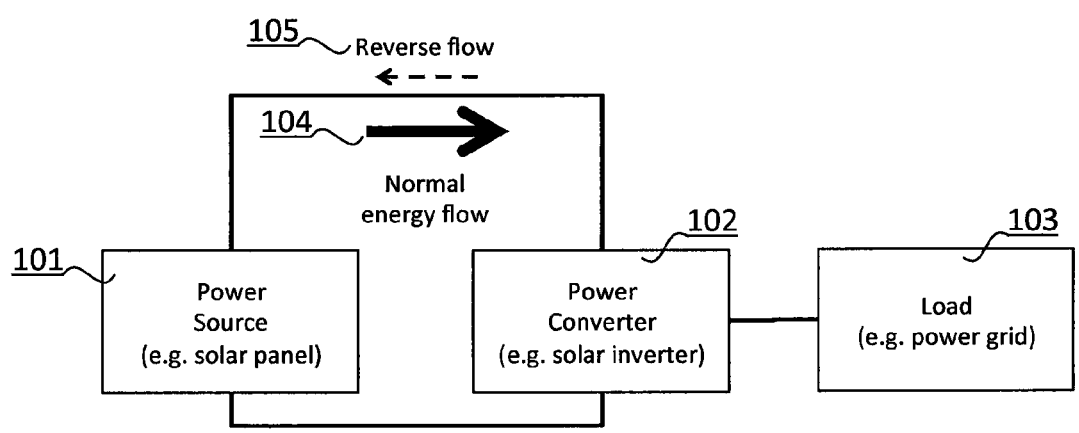
FIG. 1 depicts forward (normal) and reverse energy flow between a generic energy source and power converter.
Figure 2A:
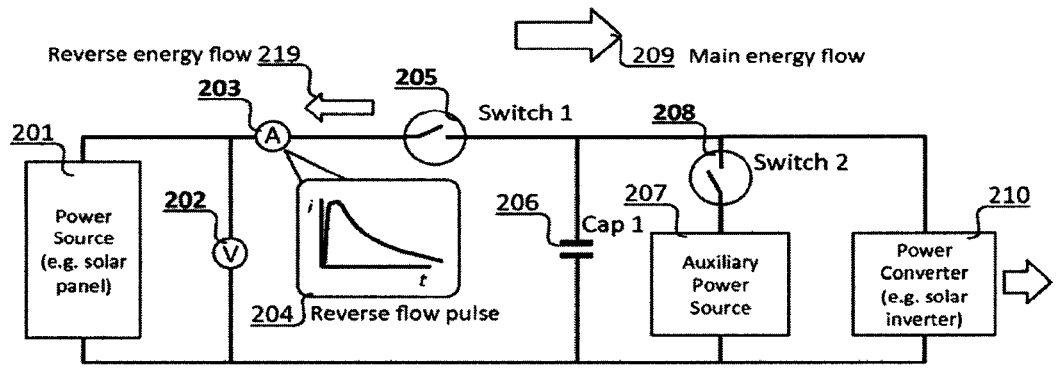
FIG. 2A depicts circuitry for implementing reverse energy flow in accordance with an exemplary embodiment of the presently claimed invention.
Figure 2B:
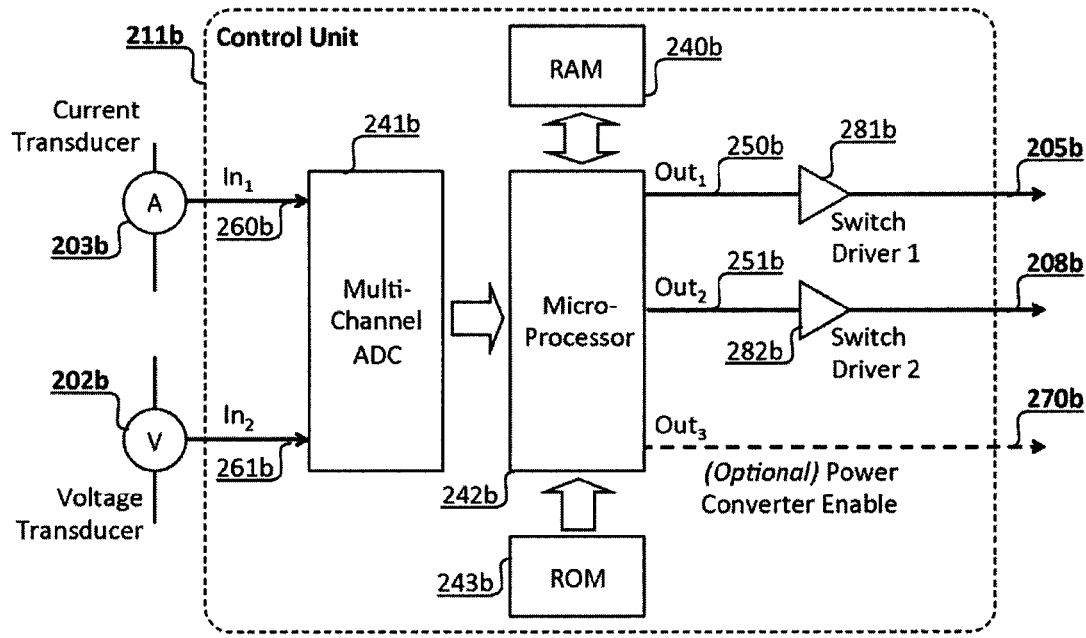
FIG. 2B depicts a control unit for the circuitry of FIG. 2(a) in accordance with an exemplary embodiment of the presently claimed invention.

Main operation of the circuitry in FIG. 2A is such that when power is being generated it flows from the power source (201) to the power converter (210) in the normal way (209). Additionally there is reverse energy flow (219) circuitry that may be switched in when the power source is not generating. The additional circuitry allows charge to build up from a low power auxiliary power source (207), and be stored in a capacitor Cap 1 (206). When Switch 1 (205) is engaged the energy is released as a current pulse that travels through to the power source and decays over time (204). This pulse may be used to explore characteristics of the power source through voltage (202) and current (203) measurements. Voltage (202) and current (203) measurements are made with transducers (202b, 203b) and converted to digital signals by the multi-channel ADC (241b) in the control unit (211b). The digital signals from the ADC (241b) are received by the microprocessor (242b). The microprocessor (242b) has outputs Out.Sub.1, Out.Sub.2 that control switch drivers 1 & 2 (281b, 282b) respectively. Switch driver outputs (205b, 208b) drive switches (205) and (208) in FIG. 2A, for example. For alternate implementations (such as FIGS. 3A-3B, described later) Out.Sub.3 may be used to provide a power converter enable signal (270b) to the power converter (307) in FIG. 3A, for example.

Switch 1 (205) remains open while energy builds up in the capacitor Cap 1 (206), and temporarily closes to generate the pulse. It can be desirable to send pulses regularly to provide frequent updates on system status, and to vary the time between pulses adaptively.

Once a pulse is created and applied to the power source (201), the system is monitored using the built in voltage (202) and current (203) measuring devices. Capture and storage of baseline measurements allows a reference performance to be established. Subsequent measurements may be compared against this reference, and differences detected. These may be used to distinguish between fault signatures, theft (see later) etc.

Alternatively the pulse can be applied during daytime operation while the system is generating; in this case measurement of the dynamic impedance of the power source (201) can be made. In such a case, the Auxiliary Power Source (207) should contain sufficient power storage to enable it to create the pulse. For example, a capacitor inside the Auxiliary Power Source (207) would serve this purpose; it would be charged to a voltage higher than is present at the time on capacitor Cap 1 (206). Closing Switch 2 (208) will create the pulse from the stored energy. The energy pulse will discharge partially into capacitor Cap 1 (206) and the power converter (210). It will also pass through Switch 1 (205), which will be closed, and into the Power Source (201), and then be measured by the current (203) and voltage (202) measuring devices.

Optionally, the auxiliary power source (207) could be capable of charging the capacitor with either polarity voltage; this provides additional capability when measuring the power source. For example, a solar panel will often contains bypass diodes. The cells will show a characteristic measured response with pulse of one polarity while the bypass diodes will show a characteristic measured response for pulses of the opposite polarity. Using pulses of both polarities allows both to be measured.

Figure 2C:
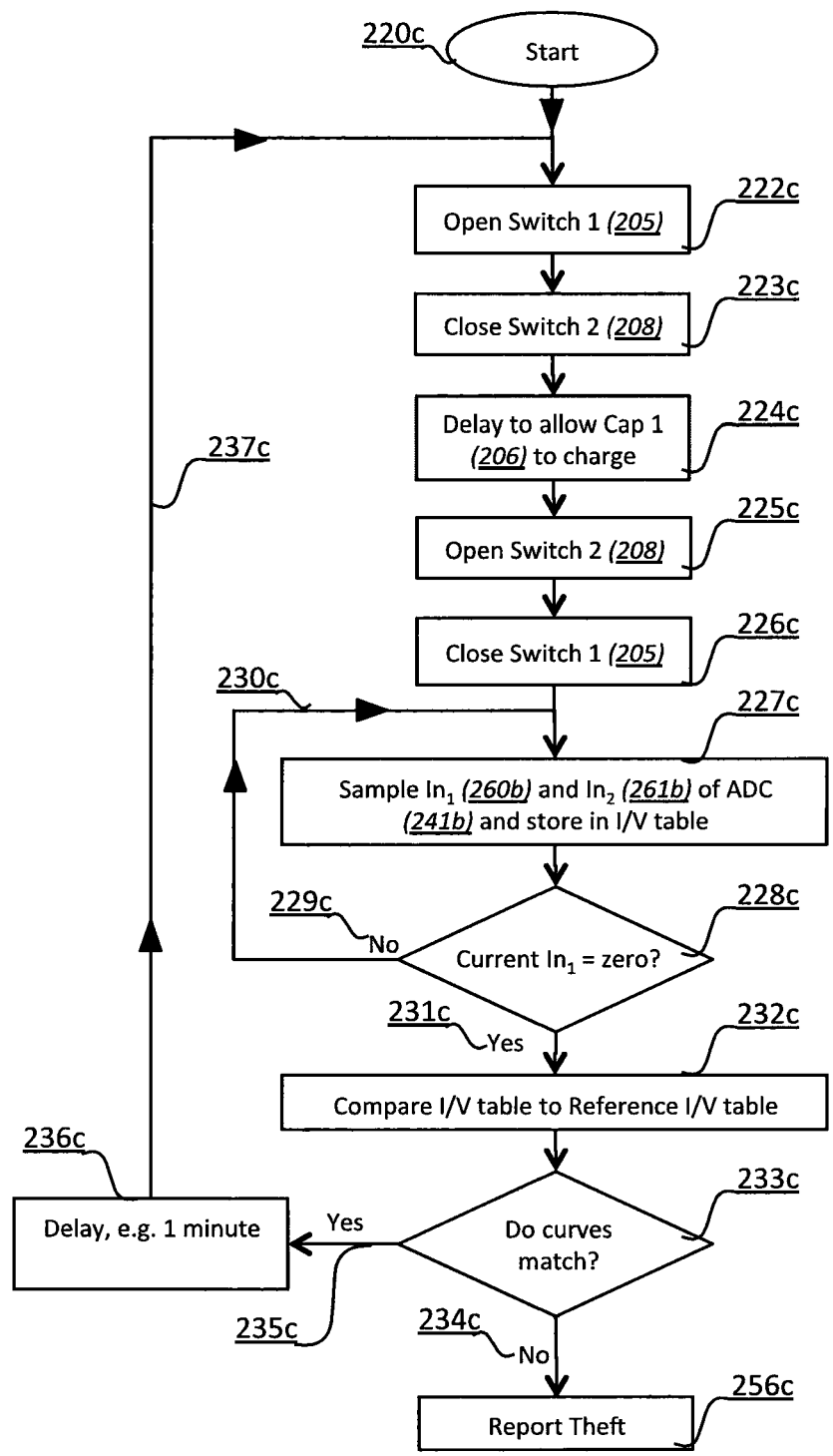
FIG. 2C depicts a logical flow for operation of the circuitry of FIG. 2(a) in accordance with an exemplary embodiment of the presently claimed invention.

The logical flow used by the control unit (211b) is shown in FIG. 2C. This applies to an individual panel or to a string.

Figure 3A:
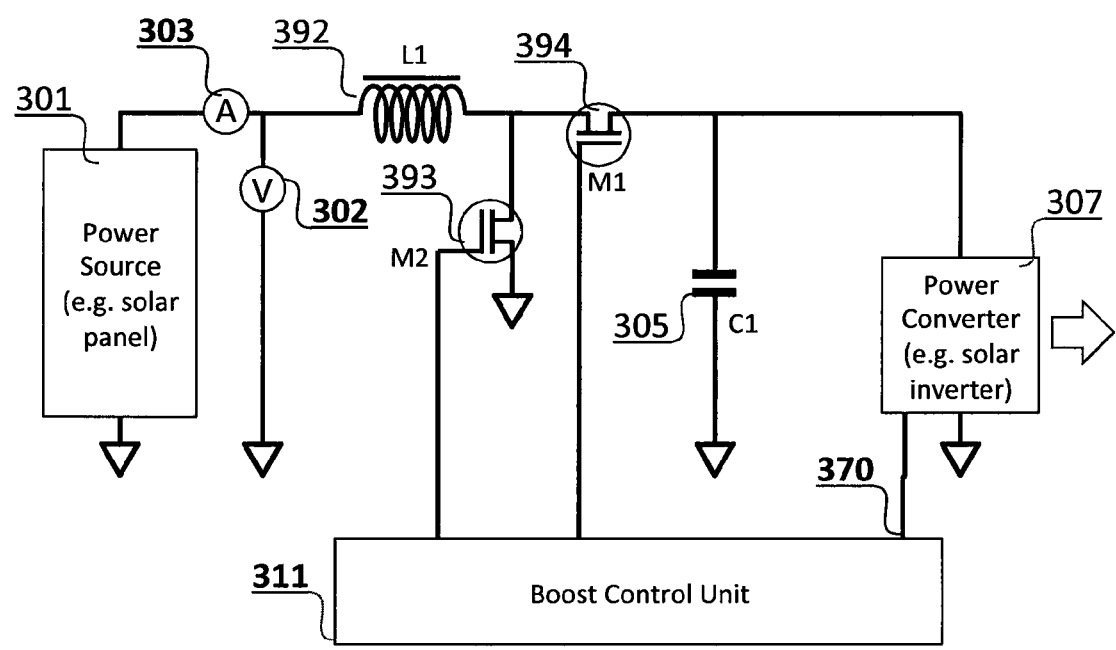
FIG. 3A depicts circuitry for implementing a boost converter with synchronous rectification in accordance with an exemplary embodiment of the presently claimed invention.

Other architectures are possible that achieve a similar result, for example the power converter itself could be bi-directional and able to channel energy in reverse if desired, negating the need for any additional circuitry such as (207). A preferred implementation is shown in FIG. 3A.

In this apparatus the power converter (307) is connected to the synchronous boost converter (392, 393, 394, 305 together), various forms of which are known in the art, and is capable of supplying reverse energy pulses. Switch M1 (394) is switched on to provide a path for the pulses to go to the power source (301), through the inductor L1. Switch M2 is switched off to disable the path to ground.

Figure 3B:
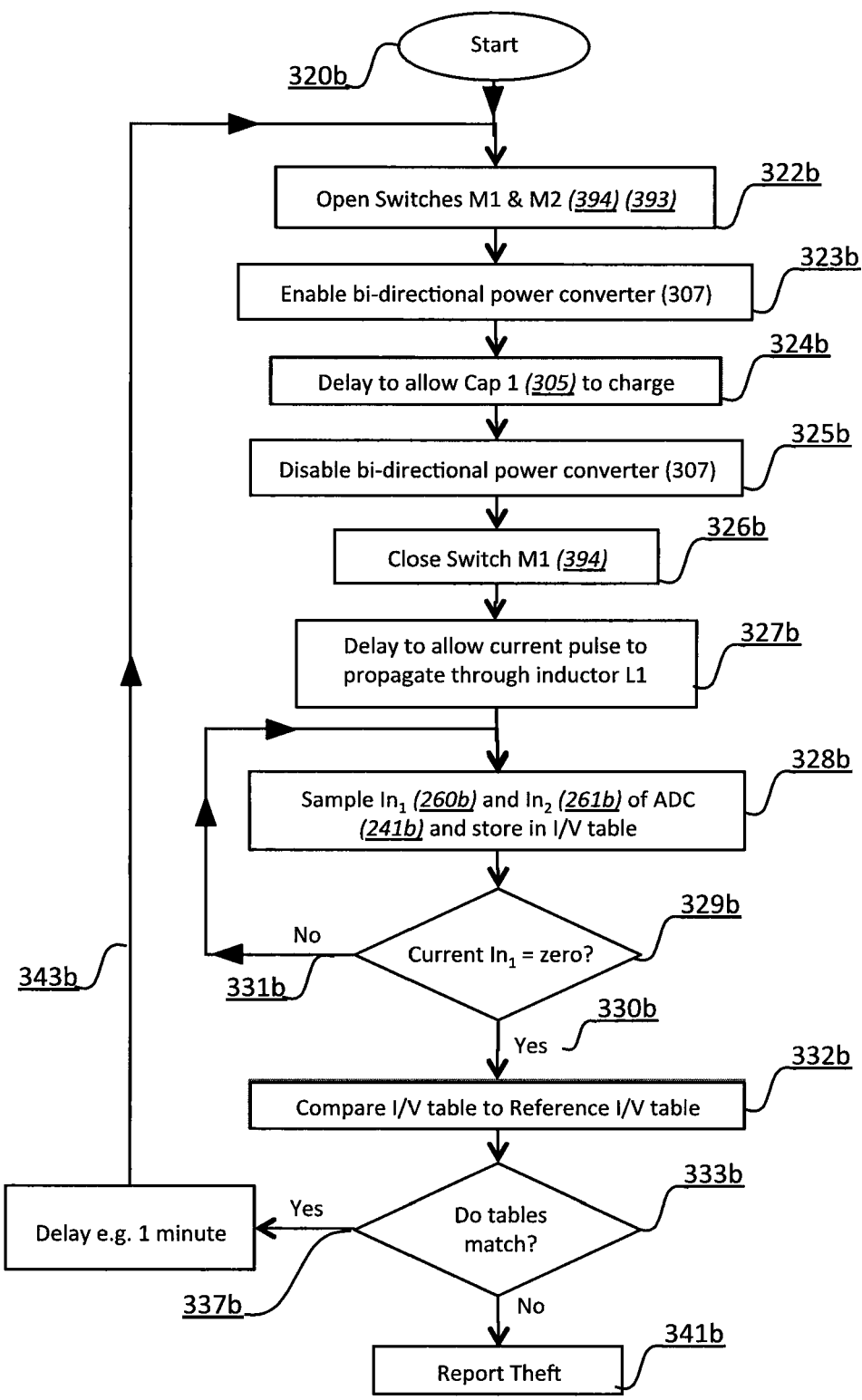
FIG. 3B depicts a logical flow for operation of the circuitry of FIG. 3(a) in accordance with an exemplary embodiment of the presently claimed invention.

The logical flow used by the boost control unit (311) is shown in FIG. 3B. This applies to an individual panel or to a string.

Alternatively the power converter (307) can supply a steady voltage and the reverse flow pulses are created from the PWM operation of switches M1 and M2 (393, 394).

Panel Theft Detection With Minimal False Alarms

Theft is detected through the removal of panels. Panel removal results in change to the typical I/V curve to an open-circuit, or possibly a short circuit if a thief tries to fool anti-theft precautions.

It is common to place power sources in series in order to increase voltage; examples include batteries and solar panels. One issue with this is that if the chain is broken, current ceases to flow. This is problematic for a theft-detection scheme as this means no more information is available to provide clues whether property is being stolen, or whether there has simply been a connector failure or incident of rodent damage in one location.

Figure 4A:
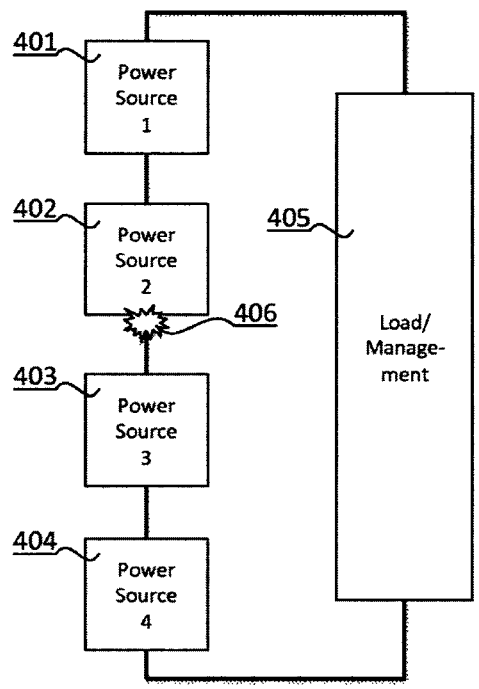
FIGS. 4A and 4B depict alternative approaches to connecting power sources in accordance with exemplary embodiments of the presently claimed invention.
Figure 4B:
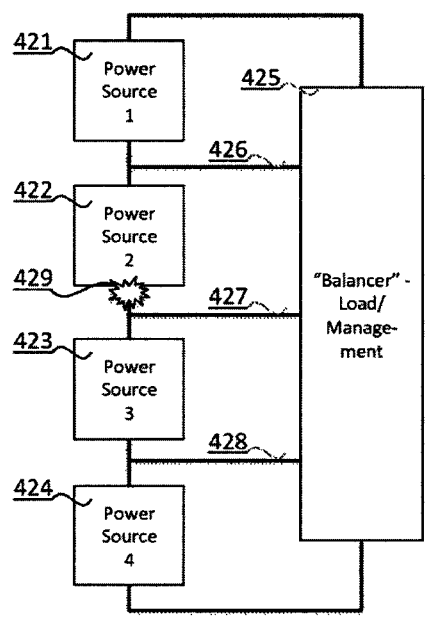

Series connection of panels is illustrated in FIG. 4A with sources (401, 402, 403, 404) connected in series to a load/management unit (405). An alternative configuration (FIG. 4B) is to wire each source back to the load/management unit (425). The load/management unit performs several functions using the same circuitry, and is also referred to as a 'Balancer'. (An example of such a Balancer circuit is described in U.S. Patent Publication 2010/0308660, the contents of which are incorporated herein by reference.) The panels are still connected in series, but now the disconnection of one source (406, 429) does not disable the system completely. Indeed, by internally bypassing the connection to the affected power source, it is possible to continue monitoring of the remaining sources. By doing so, it is possible to detect whether a second source is subsequently being removed and so on, in a pattern that strongly indicates the batteries or solar panels might be being stolen. Through this method, it is possible to differentiate reliably between accidental and deliberate disconnections in the system, thereby reducing false alarms.

Voltages are measured individually for each panel; if a panel is missing it will be bypassed by the Balancer circuitry allowing continued monitoring. During the day panel power generation or lack of it is used to detect missing panels. At night when no generation occurs, reverse energy flow pulses are used to detect the presence or absence of panels.

Sending periodic measurement pulses out at night allows detection of changes in the panel array; if a significant change is detected, pulses are sent more frequently in order to pinpoint subsequent changes with lower latency.

While other approaches have been available, they have the disadvantage that when one panel is stolen the string is broken, and no further information is available to reduce the instance of false alarms.

Fault Detection and Identification

Figure 5:
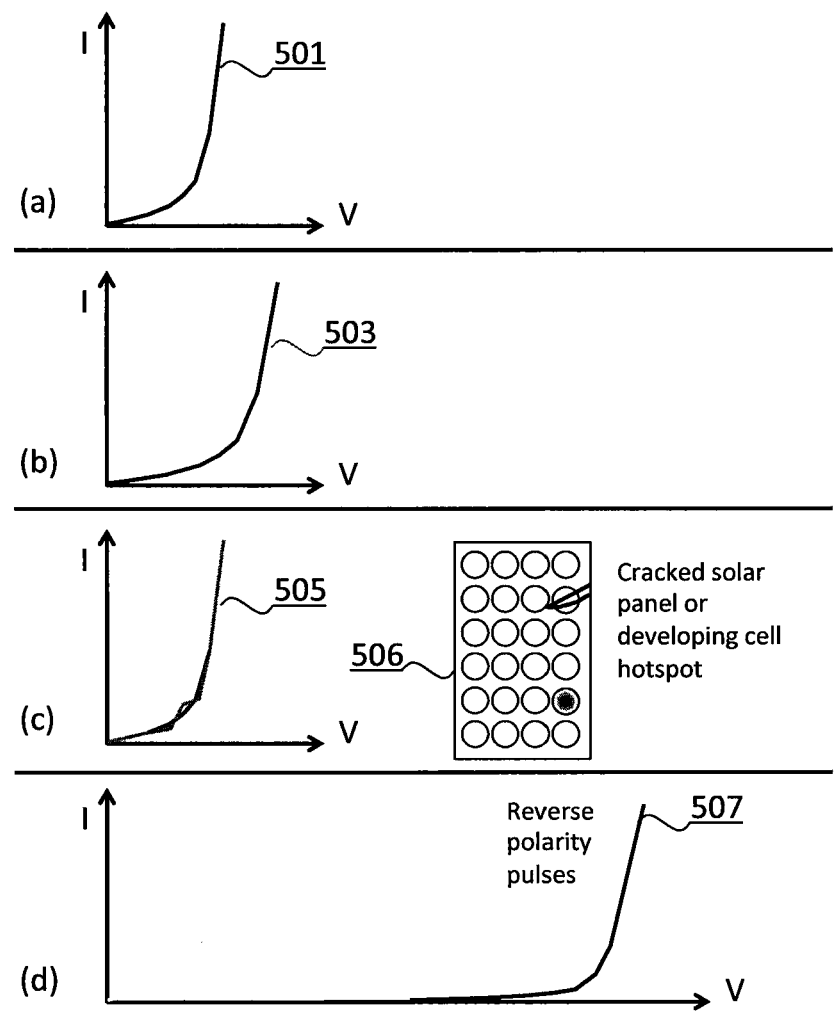
FIG. 5 depicts graphs (a)-(d) of current (I) versus voltage (V) characteristics for exemplary power source faults.

Using the apparatus with reverse energy flow described earlier, fault detection may be achieved. For a solar system as an example, the I/V curve of each power source will have a characteristic shape when measured using the reverse energy flow pulse. Pulses with one polarity will measure the solar panel assembly in the forward direction (graph (a) of FIG. 5). The electrical connection will consist of series resistance of the external cabling, resistance of the internal wiring, and also the solar cell chain with its characteristic shape (501). Measurements are made using the voltmeter (202) and ammeter (203) circuits described earlier. Nominally I/V curves will have a shape (501) shown in graph (a) of FIG. 5. Comparison to the baseline which is stored as a set of points in the control unit (211b, 311) will show when faults develop such as illustrated in graphs (b) and (c) of FIG. 5. For example, increased series resistance will cause the I/V curve shape to move to the right (503), while a cracked panel or cell hotspot (506) will cause the shape of the curve to change (505). By reversing the polarity of the pulse, the health of the panel bypass diodes will be measured. Cracked or damaged diodes (508) will display an altered curve shape (507) as shown in graph (d) of FIG. 5.

Directing reverse flow energy to one panel through a Balancer can cause detectable changes in the panel such as heating or, if the energy is modulated, in electromagnetic field. This can be used to aid panel identification during installation, and is described in more detail in U.S. Patent Application 61/820,483, the contents of which are incorporated herein by reference.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a system for applying a reverse energy flow for measuring one or more electrical characteristics of a DC power source, comprising:
    one or more electrodes for connecting to a DC power source, including an output electrode for conveying a voltage, a source current originating from said DC power source and a reverse current to said DC power source;
    transducer circuitry coupled to at least said output electrode and responsive to one or more electrical signals by providing at least one transducer signal related to respective values of each one of said one or more electrical signals, wherein said one or more electrical signals include at least one of said voltage and reverse current;
    control circuitry coupled to said transducer circuitry and responsive to said at least one transducer signal by providing one or more control signals; and
    a reverse power source coupled to said control circuitry and at least said output electrode, and responsive to said one or more control signals by providing said reverse current.

2. The apparatus of claim 1, wherein said transducer circuitry comprises current transducer circuitry.

3. The apparatus of claim 1, wherein said transducer circuitry comprises voltage transducer circuitry.

4. The apparatus of claim 1, wherein:
    said at least one transducer signal comprises at least one analog signal; and
    said control circuitry comprises
        conversion circuitry responsive to said at least one analog signal by providing at least one digital signal, and
        processing circuitry coupled to said conversion circuitry and responsive to said at least one digital signal by providing said one or more control signals.

5. The apparatus of claim 1, wherein said reverse power source comprises pulse generator circuitry.

6. The apparatus of claim 1, wherein said reverse power source comprises a DC power source.

7. The apparatus of claim 1, wherein said reverse power source comprises synchronous boost converter circuitry.

8. A method for applying a reverse energy flow for measuring one or more electrical characteristics of a DC power source, comprising:
    connecting to one or more electrodes of a DC power source, including an output electrode for conveying a voltage, a source current originating from said DC power source and conveying a reverse current to said DC power source;
    responding to one or more electrical signals received via at least said output electrode by providing at least one transducer signal related to respective values of each one of said one or more electrical signals, wherein said one or more electrical signals include at least one of said voltage and reverse current;
    responding to said at least one transducer signal by providing one or more control signals; and
    responding to said one or more control signals by providing said reverse current via at least said output electrode.

9. The method of claim 8, wherein said responding to one or more electrical signals received via at least said output electrode by providing at least one transducer signal related to respective values of each one of said one or more electrical signals comprises measuring said reverse current.

10. The method of claim 8, wherein said responding to one or more electrical signals received via at least said output electrode by providing at least one transducer signal related to respective values of each one of said one or more electrical signals comprises measuring said reverse voltage.

11. The method of claim 8, wherein:
    said responding to one or more electrical signals received via at least said output electrode by providing at least one transducer signal comprises providing at least one analog signal; and
    said responding to said at least one transducer signal by providing one or more control signals comprises
        converting said at least one analog signal to at least one digital signal, and
        processing said at least one digital signal to provide said one or more control signals.

12. The method of claim 8, wherein said responding to said one or more control signals by providing said reverse current and voltage comprises generating an electrical pulse.

13. The method of claim 8, wherein said responding to said one or more control signals by providing said reverse current and voltage comprises generating a DC current and voltage.

* * * * *